July 11, 1972 P. ALBUS 3,676,126

PLANAR TECHNIQUE FOR PRODUCING SEMICONDUCTOR MICROCOMPONENTS

Original Filed Nov. 22, 1966

3,676,126
PLANAR TECHNIQUE FOR PRODUCING SEMICONDUCTOR MICROCOMPONENTS

Peter Albus, Munich, Germany, assignor to Siemens Aktiengesellschaft, Berlin, Germany Continuation of abandoned application Ser. No. 596,305, Nov. 22, 1966. This application Jan. 19, 1970, Ser. No. 4,446
Int. Cl. G03c *5/00*
U.S. Cl. 96—36.2 7 Claims

ABSTRACT OF THE DISCLOSURE

The planar technique is improved by dissolving the part of oxide layer which forms on the semiconductor surface during diffusion of the emitter zone. The oxide layer may be phosphorus oxide glass. HF buffered with $NH_4F$ is illustratory of dissolvent.

Figure 1:
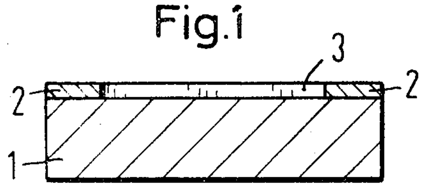

This is a continuation of application Ser. No. 596,305, filed Nov. 22, 1966 now abandoned.

Ultrahigh frequency transistors have been produced in recent years by a great variety of processes involving the formation of pnp or npn junction structures with very thin base regions and slight capacitances. The production of such base regions is particularly favored in silicon semiconductor structural components. This is because the $SiO_2$ skin which occurs at the surface during oxidation with the aid of the photo lacquer (varnish) technique constitutes an ideal masking for emitter diffusion. Thus, the emitter junction does not have to be produced by vapor deposition and alloying-in of suitable metal spots, whereby the base thickness is determined by the distance between diffusion depth and alloying front. Since the alloying process is more difficult to control than the diffusion process, it has become the practice when using silicon for semiconductor components to use only the diffusion process in order to determine the concentration and the thickness of the base layer. Furthermore, the quartz (silicon dioxide) skin produced on the silicon by thermic oxidation not only acts as a diffusion mask but also is a perfect surface protection for the finished structural component and increases the stability thereof. Contacting is effected so that with the aid of the photo technique, windows are etched into the oxide skin through which the contact metal is vaporized so that the p-n junctions never emerge at exposed surfaces, but only at surfaces covered by a silicon dioxide layer. Such semiconductor components have high stability and small leakage currents.

When making high frequency transistors with very small geometrical dimensions, for example having emitter structures of less than 20$\mu$ strip width, the windows intended for application of the contacts can no longer be adjusted. Hence, one should take advantage of the fact that the oxide layer is thinnest on the emitter. Accordingly, the entire surface is etched until the emitter is free of oxide, leaivng part of the oxide layer at the base and collector regions. The phosphorus oxide glass which grew during the phosphorus diffusion for the production of the emitter, is completely removed in this manner. This results in loss of the surface stabilizing effect of the phosphorus glass layer. Channel effects or concentration rim layers and junction resistances may occur at the contacts since no sharp etching contours are present.

The present invention has as an object the overcoming of these difficulties. Accordingly, a plurality of semiconductor microcomponents, particularly for integrated circuits containing silicon planar transistors or for high frequency silicon planar transistors, are prepared utilizing the known methods of the planar technique employed up to the production of the emitter region. At this point the present invention is utilized. The oxide layer according to this invention, which forms on the semiconductor surface during the diffusion of the emitter zone and is preferably a phosphorus oxide glass layer, is dissolved in specific regions by the application of a special photo technique, so that the area of the region from which the oxide layer is removed is larger than the surface of the emitter zone emerging at the crystal surface. Certain regions of the semiconductor crystal surface remain protected by the non-dissolved portions of the oxide layer. This phosphorus oxide glass layer has the formula $(SiO_2)_n \cdot P_2O_5$ wherein $n$ is between 1 and 100.

In a further development of the invention the oxide layer produced during the diffusion of the emitter zone is dissolved in such a way that the regions surrounding the emitter surface and a portion of the emitter surface become exposed.

In one embodiment of the invention, said oxide layer forming on the semiconductor surface during diffusion of the emitter zone, preferably a phosphorus glass layer, is removed by a special photo method whereby the surface area of the region freed from the oxide layer is less than the surface area of the base region.

Those regions of the semiconductor crystal surface whose contact paths bridge the collector-base p-n junction and the emitter-base p-n junction are protected by the non-dissolved parts of the oxide layer. Thus, during the etching process whereby the emitter is etched free the oxide glass stabilizing the surface, especially the phosphorus oxide glass formed during the production of an n-doped emitter region, is dissolved above the collector-base p-n junction and above the emitter-base p-n junction at points where the latter are bridged by the contact paths. A further advantage of the invention is the fact that the oxide thickness is not reduced below the base contact. Therefore, additional capacitances are not increased. Also, junction resistances are avoided at the contacts since, by applying the photo method, the contact openings may be etched sharper.

It is also within the framework of the present invention that the regions where the contact paths, preferably comprising aluminum, are located, above the collector original materials and above the base region, remain protected by the non-dissolved parts of the oxide layer. Such metal contact surfaces which are separated from the original collector material by the remaining oxide layer, constitute a capacitance in series with the system's capacitance.

It is particularly favorable to produce the photovarnish layer which is used for coating the oxide layer by dripping or centrifuging and, according to desired structures, by hardening at high temperatures, such as 90° C.

The oxide layer, especially the phosphorus glass layer, present in n-doped emitter regions is removed by a hydrofluoric acid solution at those locations which are not coated with photo varnish. A four percent hydrofluoric acid solution, buffered with ammonium fluoride, was found especially favorable for this purpose.

The method according to the invention is particularly suited for the production of semiconductor components, especially silicon planar transistors and silicon planar transistor-containing integrated circuits.

It is equally suited for the production of semiconductor components whose surfaces are provided with stabilizing oxide layers, whereby an oxide layer is produced by thermal oxidation, in an additional process, on the semiconductor surface, said layer being only partially removed, according to my invention.

The method will be explained in greater detail with respect to an embodiment example and the accompanying drawing in which FIGS. 1–4 show the method steps used in planar technique for the production of a n-p-n silicon planar transistors; and FIGS. 5 and 6 respectively show a cross section and plan view of the special photo technique of the invention for laying bare the emitter by etching.

In all figures the same number has the same meaning.

In greater detail, FIG. 1 illustrates a section of an n-doped silicon crystal disc 1, which is provided with an oxide skin ($SiO_2$) by oxidation with moist oxygen, at high temperatures. With the aid of the known photo method, holes or windows 3 are etched into said oxide skin so that the portion of the silicon dioxide skin 2 remains.

Figure 2:
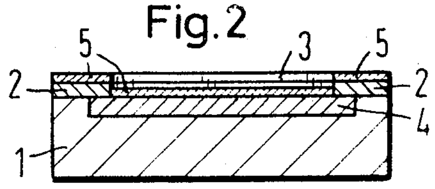

In FIG. 2 boron is indiffused through the openings 3 into the semiconductor crystal disc 1. This results in p-doped zone 4 which functions as the base zone. Subsequent oxidation provides the entire surface, including the regions corresponding to oxide skin 2, with a new oxide layer 5.

Figure 3:
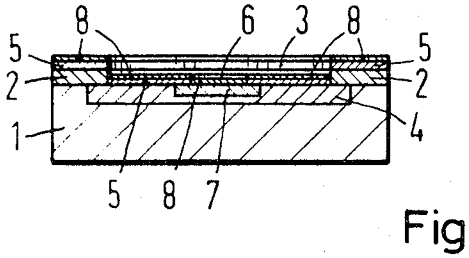
Figure 4:
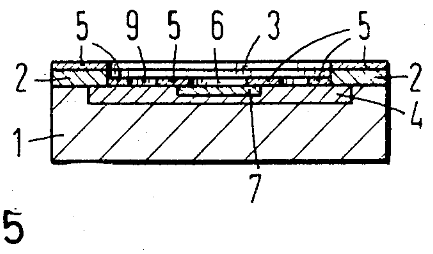

With the aid of another photo technique, as shown in FIG. 3, the emitter structure 6 is etched into this oxide layer, so that the portions marked 5 of the last oxide layer applied remain. The emitter zone 7 is produced by the indiffusion of phosphorus into the p-doped base zone marked 4. The entire silicon monocrystal disc is thereby coated with a phosphorus oxide glass layer 8.

In high frequency transistors with very small geometrical dimensions, for example having emitter structures of less than $20\mu$ strip width, contact openings for inserting the emitter contacts cannot be adjusted. Thus the base contact windows 9 are etched and the entire surface of the crystal disc is re-etched until the emitter is again free of oxide so that I obtain the arrangement shown in FIG. 4. The stabilizing effect of the phosphorus glass layer is, however, lost thereby.

Figure 5:
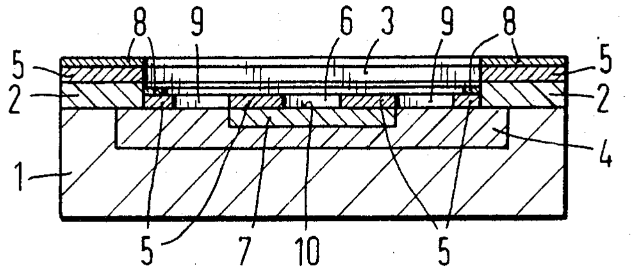

The arrangement shown in FIG. 5 is according to my invention. Instead of etching the entire emitter surface, the phosphorus oxide glass layer is only partly removed by applying a photo method for the purpose of protecting specific regions of the semiconductor component. Thus, the silicon monocrystal disc 1, containing a plurality of semiconductor components systems, after being heated at approximately 800° C. for 10 minutes, is provided with a conventional photo varnish layer of approximately $0.5\mu$ thickness, by means of centrifuging or dripping. Then, the desired structure for emitter etching is reproduced by exposing it to light using a pattern or mask. After removing the exposed parts, the photo varnish layer which remains to protect specific regions of the semiconductor components is hardened at approximately 90° C., for a period of 15 minutes. The uncovered phosphorus glass layer is removed from the semiconductor surface by etching in 4% fluoric acid solution buffered with ammonium fluoride, at 12° C. for approximately one minute. The remaining photo varnish is then removed in a known manner, for example with acetone, and the semiconductor crystal disc is prepared for the next production step, i.e. the application of the contact paths.

FIG. 5 shows a section of an embodiment of such an arrangement wherein the regions of the phosphorus glass layer marked 8 were not removed during the etching free of the emitter. The regions 9 are for base contacting. The emitter contact is applied at 10. The other numerals are the same as in preceding figures.

Figure 6:
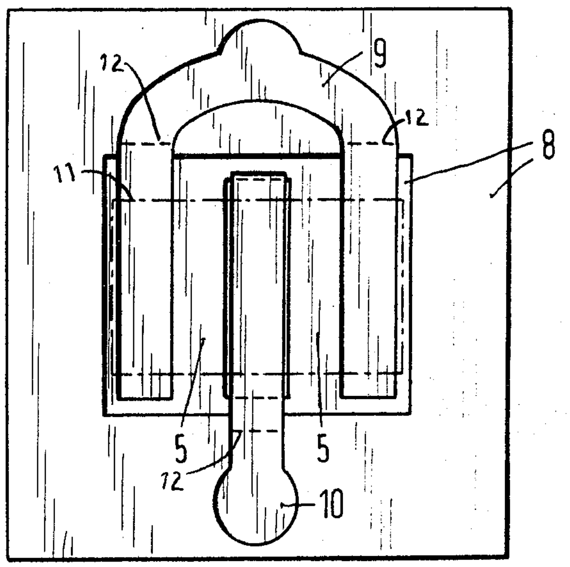

FIG. 6 is a top view of a semiconductor component system equipped with lead paths, for example by means of vapor deposited aluminum paths (9 and 10). The oxide layer above the base zone is seen at 5, and the phosphorus oxide glass layer at 8. The dot-dash line 11 in FIG. 6 shows the area from which the oxide glass layer was dissolved. The dash lines 12 shows the location at which the emitter-base p-n junctions and the collector-base p-n junctions, protected by the phosphorus oxide glass layer, are bridged by the metal leads.

I claim:

1. In the method of producing a plurality of semiconductor microcomponents by planar technique, particularly for silicon planar transistors containing integrated circuits and high frequency silicon planar transistors, the improvement which comprises depositing phosphorus through a window cut in a silicon dioxide surface layer on the semiconductor, to form the emitter zone to a phosphorus oxide glass layer, applying a photo resist layer on the phosphorus oxide glass layer, exposing the photo resist layer to light of a pattern whereby the exposed areas are insolubilized, washing to remove the unexposed area of the photosensitive varnish so that the surface area of the region freed from the dioxide layer is larger than the area surface of the emitter zone emerging to the crystal surface and smaller than the base zone which remains protected by the non-dissolved portions of the phosphorus oxide layer.

2. The process of claim 1, wherein the regions of dioxide layer dissolved surround the emitter area and a portion of the emitter area.

3. The process of claim 2, wherein the region of the dioxide layer removed is less than the area of the base region.

4. The process of claim 3, wherein those locations where the contact paths bridge the collector-base p-n junctions and the emitter-base p-n junctions are protected by the non-dissolved portions of the oxide layer.

5. The process of claim 4, wherein the contact paths located above the original collector material, and preferably of aluminum, are protected by the non-dissolved portions of the oxide layer.

6. The process of claim 4, wherein the contact paths located above the base region are preferably of aluminum and are protected by the non-dissolved portions of the oxide layer.

7. In the method of producing a plurality of semi-conductor microcomponents by planar technique the improvement which comprises forming an emitter zone by phosphorus diffusion and the concomitant formation of a phosphorus oxide glass layer on the surface of a semiconductor device, applying a photo resist to the surface, exposing the photo resist, protected by a suitable mask, to light so that part of the emitter area and part of the area to either of the large sides of the emitter area is exposed, said exposed area being less than the area of the base region, removing the exposed photo lacquer, removing the phosphorus oxide glass at the non-protected area by etching with a 4% HF solution buffered with $NH_4F$, removing the remaining photo varnish, and applying the contact paths.

References Cited

UNITED STATES PATENTS

| | | | |
|---|---|---|---|
| 2,981,877 | 4/1961 | Noyce | 96—36.2 |
| 3,025,589 | 3/1962 | Hoerni | 96—36.2 |
| 3,122,817 | 3/1964 | Andrus | 96—36.2 |
| 3,167,463 | 1/1965 | Patsko | 96—36.2 |

OTHER REFERENCES

"Kodak Photosensitive Resists for Industry," E. Kodak, 1962, p. 32.

NORMAN G. TORCHIN, Primary Examiner

E. C. KIMLIN, Assistant Examiner

U.S. Cl. X.R.

29—578